US 7,470,754 B2

(12) United States Patent
Nikaido et al.

(10) Patent No.: US 7,470,754 B2
(45) Date of Patent: *Dec. 30, 2008

(54) BIPHENYLARALKYL EPOXY AND PHENOLIC RESINS

(75) Inventors: Hiroki Nikaido, Tochigi (JP); Hirofumi Kuroda, Tochigi (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 479 days.

This patent is subject to a terminal disclaimer.

(21) Appl. No.: 11/075,125

(22) Filed: Mar. 8, 2005

(65) Prior Publication Data

US 2005/0208307 A1    Sep. 22, 2005

(30) Foreign Application Priority Data

Mar. 16, 2004 (JP) ............................. 2004-075413

(51) Int. Cl.
*C08L 63/04* (2006.01)
*H01L 23/29* (2006.01)

(52) U.S. Cl. ...................................... 525/481; 257/793

(58) Field of Classification Search ........................ None
See application file for complete search history.

(56) References Cited

U.S. PATENT DOCUMENTS

| 6,297,306 B1 * | 10/2001 | Osada et al. ................. 524/406 |
| 6,830,825 B2 | 12/2004 | Sumiyoshi |
| 7,157,313 B2 * | 1/2007 | Kuroda ........................ 438/127 |
| 2003/0187107 A1 | 10/2003 | Sumiyoshi |

FOREIGN PATENT DOCUMENTS

| JP | 06-080763 | 3/1994 |
| JP | 09-003161 | 1/1997 |
| JP | 09-003167 | 1/1997 |
| JP | 09-235353 | 9/1997 |
| JP | 11-140277 | 5/1999 |
| JP | 2000-034393 | 2/2000 |
| JP | 2001-329051 | 11/2001 |
| JP | 2002-221792 A * | 8/2002 |
| JP | 2002-348350 | 12/2002 |
| JP | 2003-113225 | 4/2003 |
| JP | 2003-113225 A * | 4/2003 |
| JP | 2003-261646 | 9/2003 |
| JP | 2003-261746 | 9/2003 |
| JP | 2003-292574 | 10/2003 |
| JP | 2005-89486 | 4/2005 |

OTHER PUBLICATIONS

Derwent accession No. 2000-227357 for Japanese Patent No. 2000-34393 and U.S. Patent No. 6,297,306, Osada et al., Feb. 2, 2000, one page.*

* cited by examiner

*Primary Examiner*—Robert Sellers
(74) *Attorney, Agent, or Firm*—Smith, Gambrell & Russell, LLP

(57) ABSTRACT

An objective of this invention is to provide an epoxy resin composition for encapsulating a semiconductor free from a harmful substance out of regard for the environment, which exhibits excellent soldering heat resistance and a higher productivity, as well as a semiconductor device manufactured by encapsulating therewith. This invention relates to a epoxy resin composition for encapsulating a semiconductor comprising, as essential components, (A) an epoxy resin having a particular structure and (B) a phenolic resin comprising a phenolic resin component having a particular structure as a main component, which contains a component having up to three aromatic rings in one molecule in 0.8% or less in an area ratio as determined by GPC analysis, as well as a semiconductor device manufactured by encapsulating a semiconductor chip with the composition.

9 Claims, No Drawings

BIPHENYLARALKYL EPOXY AND PHENOLIC RESINS

This application is based on Japanese patent application NO. 2004-075413, the content of which is incorporated hereinto by reference.

BACKGROUND OF THE INVENTION

1. Field of the Invention

This invention relates to an epoxy resin composition and an epoxy-resin encapsulated semiconductor device encapsulated with the epoxy resin composition. In particular, this invention is for providing an epoxy resin composition for encapsulating a semiconductor which shows flame retardance without a flame retardant such as a halogenated organic compound and antimony and may give an improved productivity because of its higher moldability, as well as an epoxy-resin encapsulated semiconductor device which is heat-resistant during soldering.

2. Description of the Related Art

Recent market trend to size reduction, weight saving and higher performance in electronic devices has led to more integrated semiconductors and accelerated surface mounting of a semiconductor package. Meanwhile, as business activity giving consideration to the global environment has become more significant, there have been attempts to shifting from a consumeristic society to a cyclical society. Thus, material design allowing for segregation and recovery has become significant. Waste Electrical and Electronic Equipment (WEEE) and Restriction of Certain Hazardous Substances (RoHS) established by EU (European Union) ordain that due to its harm, the use of lead which is a solder component should be completely abolished by 2006 except certain applications, and that in terms of a flame retardant, halogenated flame retardants predominantly used should be segregated for recovery.

However, a lead-free solder has a higher melting point than a conventional lead/tin solder. It may lead to elevation of a temperature during mounting by soldering such as infrared reflow and solder immersion from a current level, 220 to 240° C. to 240 to 260° C. Such elevation in a mounting temperature may increase cracks in a resin during mounting, making it difficult to ensure the reliability of the semiconductor device. Furthermore, in terms of a lead frame, the use of a lead frame plated with nickel/palladium instead of external solder plating has been investigated in the light of the requirement of deleading in external solder plating. A nickel/palladium plating has a poor adhesion property to a common encapsulating material, leading to delamination in an interface during mounting and cracks in a resin. Particularly, since thin packages such as TSOP and LQFP have been mainly used, ensuring reliability in a semiconductor device has become a significant challenge, when using such a new material.

For solving these problems, for example, Japanese Laid-open Patent Publication No. 1994-80763 has proposed that for improving heat resistance in a solder, a biphenyl epoxy resin and a phenol aralkyl hardener are used to form a low water-absorbing epoxy resin composition comprising a filler with a higher density. Such a composition has not, however, met the above strict requirement. Furthermore, for example, Japanese Laid-open Patent Publication Nos. 1997-3167, 1997-3161 and 1997-235353 have proposed a low water-absorbing epoxy resin composition comprising a phenol aralkyl or naphthol aralkyl resin having a biphenylene structure and have disclosed that it can improve heat resistance in a solder. Any of these cannot, however, meet the requirement for flame retardance without a halogenated organic compound or antimony as a flame retardant. Since segregation for recovery is needed from environmental consideration when using such a flame retardant, there has been room for improvement in achieving adequate flame retardance.

As materials providing excellent flame retardance without a halogenated organic compound or antimony, there have been disclosed an epoxy resin composition as a combination of a Novolac type phenolic resin comprising a biphenyl derivative and/or naphthalene derivative and a Novolac type epoxy resin comprising a biphenyl derivative and/or naphthalene derivative (for example, see Japanese Laid-open Patent Publication No. 1999-140277). Such an epoxy resin composition may be effective for improving flame retardance because its molecular structure has many aromatic rings which promote carbonization during burning and its crosslinking density is so low that low-boiling components generated by thermal decomposition during burning cause foaming, which forms a surface oxygen-blocking layer. Furthermore, since cured products from such epoxy resins are adequately water-unabsorbable and heat-resistant during soldering, they have been marketed and used in various applications. The epoxy resin composition can improve heat resistance during soldering owing to its low elasticity and low water-absorption. However, it gives a soft and lipophilic mold after curing. Thus, its defective moldability may cause reduction in the productivity in continuous production, which is a problem to be solved.

There is, therefore, still the need for an epoxy resin composition for encapsulating a semiconductor, which can provide a good productivity and exhibit excellent heat resistance during soldering, taking environmental effects into account.

SUMMARY OF THE INVENTION

Therefore, an objective of this invention is to provide an epoxy resin composition for encapsulating a semiconductor, which is free from a harmful substance such as a halogenated organic compound and antimony oxide, environmentally safe, and can exhibits excellent flame retardance, heat resistance during soldering (or soldering heat resistance) and continuous molding properties, as well as a semiconductor device manufactured by encapsulating a semiconductor chip with the resin composition.

In a process for manufacturing a semiconductor device comprising encapsulating a semiconductor chip with an epoxy resin composition, some causes of reduction in an productivity are reduction in the number of continuous molding shots due to fouling in a molding and incomplete filling with a resin composition due to blocking an air vent caused by flash jamming in a fouled molding after continuous molding (hereinafter, referred to as "air-vent blocking"). Fouling in a molding and air-vent blocking significantly involve, in addition to oxidation of a mold release, low molecular weight components in an epoxy resin and a hardener. In particular, low molecular weight components in a hardener tends to be bled out to the surface of molding die, and tends to adhere to the molding via hydrogen bonding of its polar groups.

The present inventors have intensely investigated low molecular weight components in an epoxy resin composition in for encapsulating a semiconductor device, particularly those in a hardener and have finally found that in a phenolic resin mainly comprising a phenolic resin component having a particular structure, a component having up to three aromatic rings in one molecule may be contained in 0.8% or less in an area ratio as determined by GPC analysis to improve the problem of air-vent blocking, accomplishing this invention.

This invention provides;

An epoxy resin composition for encapsulating a semiconductor, essentially comprising (A) an epoxy resin represented by general formula (1):

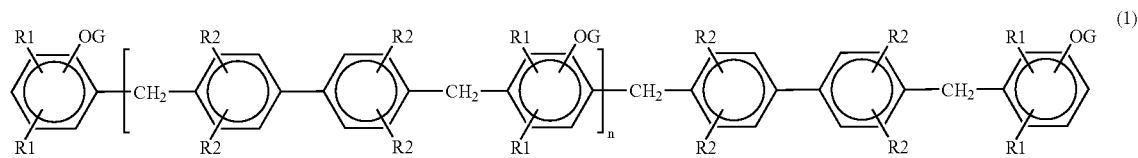

wherein n is an average within a range of 0 to 10; G represents glycidyl; R1 and R2 independently represent hydrogen or alkyl or aryl having 1 to 8 carbon atoms and R1 and R2 may be the same or different; and (B) a phenolic resin mainly comprising a phenolic resin component represented by general formula (2), in which a component having up to three aromatic rings in one molecule is contained in 0.8% or less in an area ratio as determined by GPC (Gel Permeation Chromatography) analysis;

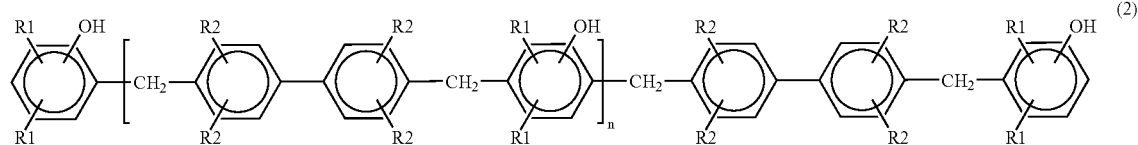

wherein n is an average within a range of 0 to 10; R1 and R2 independently represent hydrogen or alkyl or aryl having 1 to 8 carbon atoms and R1 and R2 may be the same or different;

The epoxyresin composition for encapsulating a semiconductor as described above, wherein the phenolic resin (B) is produced by reacting a compound represented by general formula (3):

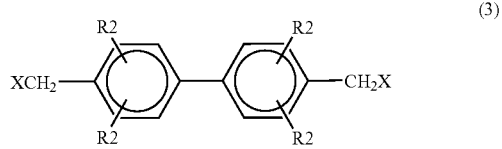

wherein X represents halogen; R2 represents hydrogen or alkyl or aryl having 1 to 8 carbon atoms; and individual R2s may be the same or different, with phenols;

The epoxy resin composition for encapsulating a semiconductor as described above, wherein the phenolic resin (B) may have a softening point of 60 to 70° C.; and A semiconductor device manufactured by encapsulating a semiconductor chip with the epoxy resin composition for encapsulating a semiconductor as described above.

This invention can provide an epoxy resin composition for encapsulating a semiconductor exhibiting excellent flame retardance and soldering heat resistance without a halogenated organic compound or antimony oxide. Furthermore, the composition can be used for encapsulating a semiconductor chip to form a semiconductor device, in which fouling in a molding or air-vent blocking can be reduced, allowing for continuous molding for a longer period.

An epoxy resin composition for encapsulating a semiconductor of this invention can provide an eco-friendly semiconductor device with excellent reliability and productivity and can be, therefore, suitably used for industrially manufacturing a semiconductor device.

DETAILED DESCRIPTION OF THE INVENTION

The invention will be now described herein with reference to illustrative embodiments. Those skilled in the art will recognize that many alternative embodiments can be accomplished using the teachings of the present invention and that the invention is not limited to the embodiments illustrated for explanatory purpose.

This invention relates to an epoxy resin composition for encapsulating a semiconductor device, essentially comprising (A) a phenol aralkyl epoxy resin having a biphenylene structure represented by general formula (1) described later, and (B) a phenolic resin mainly comprising a phenol aralkyl phenolic resin having a biphenylene structure represented by general formula (2) described later in which a component having up to three aromatic rings in one molecule is contained in 0.8% or less in an area ratio as determined by GPC analysis. Such a resin has flame retardance without a flame retardant such as a halogenated organic compound and antimony and is so moldable to give a higher productivity. The resin can be used for encapsulating to provide an epoxy-resin encapsulated semiconductor device with excellence in soldering heat resistance.

An embodiment of this invention will be described in detail.

The epoxy resin (A) used in this embodiment is represented by general formula (1):

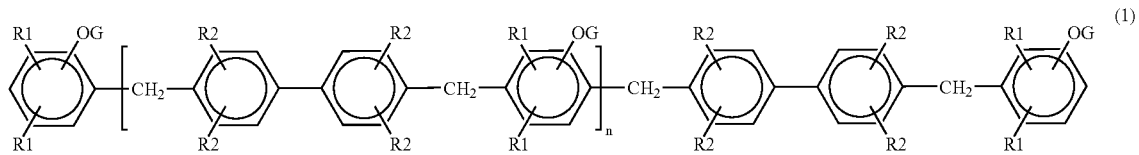

wherein n is an average within a range of 0 to 10, preferably 0 to 5; G represents glycidyl; R1 and R2 independently represent hydrogen or alkyl or aryl having 1 to 8 carbon atoms and R1 and R2 may be the same or different.

In the formula, "n" indicates an average molecular chain length. For example, when molecular chains of n=0, 1, 2 and 3 are present in 10%, 30%, 50% and 10%, respectively, in general formula (1), an average "n" is (0×10+1×30+2×50+3×10)/100=1.6.

Examples of alkyl having 1 to 8 carbon atoms for R1 or R2 include —$CH_3$, —$C_2H_5$, —$C_3H_7$ and —$C_4H_9$, particularly —$CH_3$.

Examples of aryl having 1 to 8 carbon atoms for R1 or R2 include —$C_6H_5$ and isomers represented by —$C_6H_4$—$CH_3$, particularly —$C_6H_5$.

Such an epoxy resin can be prepared by reacting the phenolic resin (B) used in this embodiment with epichlorohydrin in the presence of an alkali-metal oxide.

The epoxy resin (A) used in this embodiment may be used in combination with another epoxy resin. An epoxy resin which can be combined may be any of those having two or more epoxy groups in one molecule. Examples may include biphenyl type epoxy resins, hydroquinone type epoxy resins, stilbene type epoxy resins, bisphenol type epoxy resins, phenol Novolac type epoxy resins, cresol Novolac type epoxy resins, triphenolmethane type epoxy resins, alkyl-modified triphenolmethane type epoxy resins, triazine-core containing epoxy resins and dicyclopentadiene-modified phenol type epoxy resins. In terms of a combination ratio, if combined, the epoxy resin (A) used in this embodiment is contained preferably in 50 wt % or more, more preferably 70 wt % or more to the total amount of epoxy resins. The epoxy resin (A) can be contained within the above range to achieve adequate flame retardance. Furthermore, a ratio of the total number of phenolic hydroxyl group to the total epoxy number in the epoxy resin may be 0.5 to 1.5, where deterioration in curing properties may be minimized.

The phenolic resin (B) used in this embodiment is an epoxy resin represented by general formula (2):

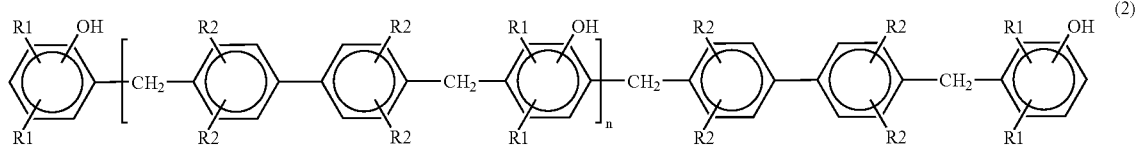

wherein n is an average within a range of 0 to 10, preferably 0 to 5; R1 and R2 independently represent hydrogen or alkyl or aryl having 1 to 8 carbon atoms and R1 and R2 may be the same or different.

In the formula, n and alkyl and aryl having 1 to 8 carbon atoms for R1 or R2 are as described above.

The phenolic resin (B) may has a softening point of 70° C. or lower indicating a low viscosity, in the light of flow properties, further a softening point is preferably 60 to 70° C., from the view of handling properties in the course of producing an epoxy resin composition.

Such a phenolic resin can be prepared by, but not limited to, condensing a compound represented by formula (3):

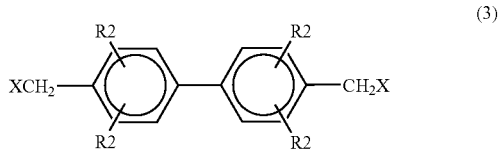

wherein X represents halogen; R2 represents hydrogen or alkyl or aryl having 1 to 8 carbon atoms; and individual R2s may be the same or different, with phenols (or a phenol compound) in the presence of an acid catalyst.

Alkyl and aryl having 1 to 8 carbon atoms for R2 areas described above.

Examples of the phenol compound which is reacted with the compound represented by general formula (3) include phenol, and substituted phenols such as cresol, methylphenol, n-propylphenol, xylenol, methylbutylphenol including o-, m- and p-isomers, cyclopentylphenol and cyclohexylphenol. These phenols may be used alone or in combination of two or more.

A phenolic resin prepared by condensation of the compound represented by general formula (3) with the phenols contains the phenolic resin component represented by general formula (2) as a main component, and is obtained as a mixture further containing a component having up to three aromatic rings in one molecule. A component having up to three aromatic rings in a mixture generally tends to exude in an air vent, causing fouling in the air vent during a molding process. As a result, such a component having up to three aromatic rings is apt to deteriorate releasability of flashes in the air vent, leading to residual flashes in the air vent. In this embodiment, a rate of the component having up to three aromatic rings in one molecule in the phenolic resin (B) is adjusted to 0.8% or less in an area ratio as determined by GPC analysis, to reduce incomplete filling due to the residual flashes in a mold part corresponding to the air vent.

Examples of the component having up to three aromatic rings in one molecule herein include compounds represented by general formulas (4) to (7).

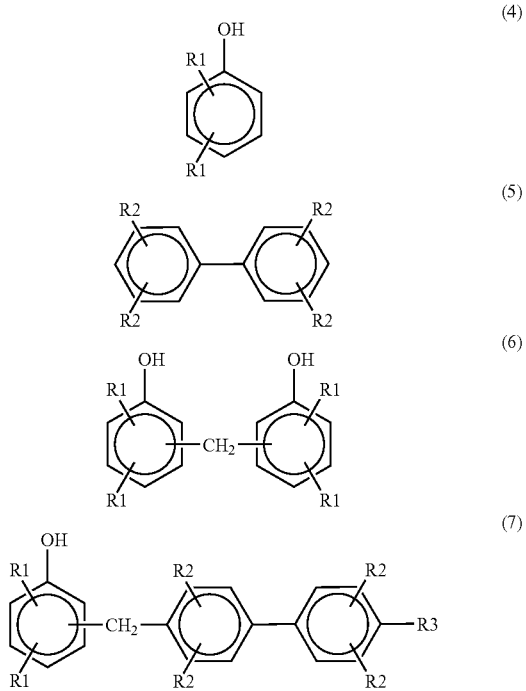

wherein R1 represents hydrogen, alkyl or aryl having 1 to 8 carbon atoms or phenol, and individual R1s may be the same or different; R2 represents hydrogen, alkyl or aryl having 1 to 8 carbon atoms, and individual R2s may be the same or different; R3 represents hydrogen, alkyl having 1 to 8 carbon atoms or aryl, or aldehyde.

In the formula, alkyl and aryl having 1 to 8 carbon atoms for R1, R2 and R3 are as described above.

The phenolic resin (B) used in this embodiment may be used in combination with another phenolic resin. A phenolic resin which can be combined may be any of those having two or more phenolic hydroxyl groups in one molecule, including phenol Novolac resins, cresol Novolac resins, dicyclopentadiene-modified phenolic resins, xylylene-modified phenolic resins, terpene-modified phenolic resins and triphenolmethane type Novolac resins. In terms of a combination ratio, if combined, the phenolic resin (B) used in this embodiment is contained preferably 30 wt % or more, more preferably 70 wt % or more, to the total amount of phenolic resins. The phenolic resin (B) may be contained within the range, to achieve adequate flame retardance.

In this embodiment, the composition comprises, as essential components, (A) an epoxy resin represented by general formula (1) and (B) a phenolic resin comprising a phenolic resin component represented by general formula (2) in which a component having up to three aromatic rings in one molecule is contained in 0.8% or less in an area ratio as determined by GPC analysis. It may further comprise (C) a curing accelerator and (D) an inorganic filler.

A curing accelerator (C) optionally used in this embodiment refers to a compound capable of acting as a catalyst in a crosslinking reaction between the epoxy resin and the phenolic resin, including, but not limited to, amines such as tributylamine; organophosphorous compounds such as triphenylphosphine and tetraphenylphosphonium tetraphenylborate; and imidazoles such as 2-methylimidazole. These curing accelerators may be used alone or in combination of two or more.

An inorganic filler (D) optionally used in this embodiment may be in the form of flakes or spheres. Spherical silica may be mainly used from the view of increasing a content of fused silica powders and inhibiting increase in a melt viscosity of a resin composition. Furthermore, in order to increase a content of spherical silica, a size distribution of the spherical silica may be adjusted to be relatively wider; for example, 82 to 92 wt %. Spherical silica may be contained within this range to reduce a content of the resin, reduce a water absorption and inhibit deterioration in soldering heat resistance while inhibiting deterioration in flowability of the resin composition.

In addition to the above components of (A) to (D), a resin composition of this embodiment may, if necessary, comprise various additives including a coupling agent such as γ-glycidoxypropyltrimethoxysilane; a low-stress component such as silicone oil and silicone rubber; a coloring agent such as carbon black; a mold release such as a natural or synthetic wax, a higher fatty acid and its metal salt and paraffins; and an antioxidant.

These components can be blended to give a mixture, which can be then kneaded by heating using a heating kneader or hot roller, cooled and pulverized to provide a desired resin composition.

For manufacturing a resin-encapsulated semiconductor device by encapsulating an electronic chip such as a semiconductor using a resin composition of this embodiment, the composition can be molded by a well-known process such as transfer molding, compression molding and injection molding. Such a resin composition may be applied to coating, insulating or encapsulating of an electric part, a transistor as an electronic part, an integrated circuit, etc.

This embodiment can provide an epoxy resin composition for encapsulating a semiconductor which has flame retardance without a flame retardant such as a halogenated organic compound and antimony and can contribute to higher productivity because of its improved moldability as well as an epoxy-resin encapsulated semiconductor device with improved soldering heat resistance. Thus, this invention can be suitably applied to a surface mounting type semiconductor device such as QFP (Quad Flat Package) and LQFP (Low profile QFP).

EXAMPLES

This invention will be more specifically described with reference to, but not limited to, Examples consisting of the following experimental examples.

The epoxy resins and the phenolic resins used in these experimental examples are as follows.

E-1: an epoxy resin represented by formula (8) (Nippon Kayaku Co., Ltd., NC-3000P, epoxy equivalent: 274, softening point: 62° C.)

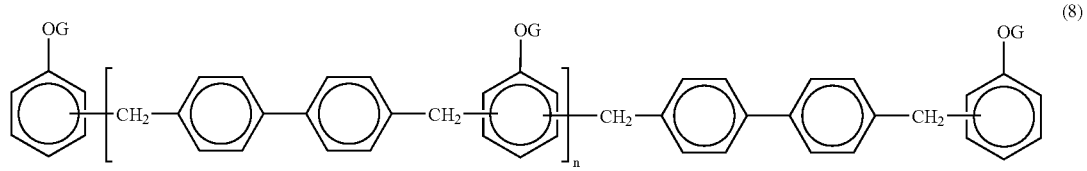

(8)

wherein G represents glycidyl.

E-2: ortho-cresol Novolac epoxy resin (Nippon Kayaku Co., Ltd., EOCN-1020, softening point 62° C., epoxy equivalent 200).

E-3: biphenyl type epoxy resin (Japan Epoxy Resins Co., Ltd., YX-4000H, melting point: 105° C., epoxy equivalent: 195).

H-1: a phenolic resin comprising a phenolic resin component represented by formula (9) as a main component, which contains a component having up to three aromatic rings in one molecule in 0.1% in an area ratio as determined by GPC (Gel Permeation Chromatography) analysis (hydroxy equivalent: 202, softening point: 65° C.).

H-2: a phenolic resin comprising a phenolic resin component represented by formula (9) as a main component, which contains a component having up to three aromatic rings in one molecule in 0.4% in an area ratio as determined by GPC (Gel Permeation Chromatography) analysis (hydroxy equivalent: 203, softening point: 67° C.).

H-3: a phenolic resin comprising a phenolic resin component represented by formula (9) as a main component, which contains a component having up to three aromatic rings in one molecule in 0.7% in an area ratio as determined by GPC (Gel Permeation Chromatography) analysis (hydroxy equivalent: 202, softening point: 65° C.).

H-4: a phenolic resin comprising a phenolic resin component represented by formula (9) as a main component, which contains a component having up to three aromatic rings in one molecule in 1.0% in an area ratio as determined by GPC (Gel Permeation Chromatography) analysis (hydroxy equivalent: 202, softening point: 67° C.).

H-5: a phenolic resin comprising a phenolic resin component represented by formula (9) as a main component, which contains a component having up to three aromatic rings in one molecule in 2.0% in an area ratio as determined by GPC (Gel Permeation Chromatography) analysis (hydroxy equivalent: 203, softening point: 67° C.).

Experimental Example 1

Epoxy resin E-1: 76.2 parts by weight
Phenolic resin H-1: 51.0 parts by weight
Triphenylphosphine: 1.8 parts by weight
Spherical fused silica powder (average particle size: 16.0 μm, maximum particle size: 75 μm): 860.0 parts by weight
γ-Glycidoxypropyltrimethoxysilane: 4.0 parts by weight
Carnauba wax: 4.0 parts by weight
Carbon black: 3.0 parts by weight All of these components were blended in a mixer and the mixture was kneaded 30 times using two rolls with surface temperatures of 90° C. and 45° C. to obtain the kneaded product sheet. The kneaded product sheet was cooled and then pulverized to give a resin composition. The resin composition was evaluated for its properties as follows. The evaluation results are shown in Table 1.

Evaluation and analyses

GPC Analyzer
Liquid feeding pump L-6000 (Hitachi, Ltd.)
UV detector: L-4000 (Hitachi, Ltd.)
Determined as an absorbance at 254 nm
Column: KF-803 (one)+KF-802.5 (two)+KF-802 (one)
Solvent: tetrahydrofuran (THF)

Spiral flow: determined a mold temperature of 175° C., a transfer pressure of 6.9 MPa and a curing time of 2 min, using a mold for measuring a spiral flow in accordance with EMMI-1-66.

Soldering heat resistance: 160 pLQFP (package size: 24×24× 1.4 (thickness) mm, frame: Cu, pad size: 8×8 mm), mounted chip size: 7×7×0.35 (thickness) mm, passivation film: PI) was transfer-molded under the conditions of a mold temperature of 180° C., a transfer pressure of 9.8 MPa, a transfer time of 7 sec, a curing time of 120 sec, and further cured at 180° C. for 4 hours to prepare a package for evaluation of soldering heat resistance. Twelve packages thus prepared were wetted under the atmosphere of a temperature of 85° C. and a relative humidity of 85% for 168 hours, and then subjected to IR

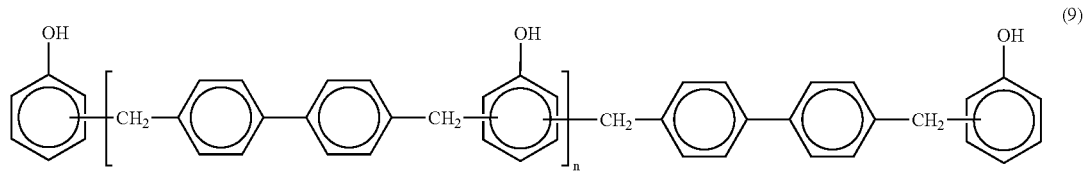

(9)

H-6: a para-xylylene-modified phenolic resin (Mitsui Chemicals, Inc., XLC-3L, softening point: 71° C., hydroxy equivalent: 175).

H-7: a phenol Novolac resin (softening point: 80° C., equivalent: 104).

reflow treatment (260° C., in accordance with the conditions of JEDEC Level 1). Each package was observed by a scanning acoustic tomograph and the number of internal cracks was expressed as a percentage for (the number of packages having cracks)/(the total number of packages).

Flame Retardance

Using a low-pressure transfer molding machine, a test piece with the size of length: 5 inches, width: ½ inch and thickness: ⅛ inch was prepared under the conditions of a mold temperature of 175° C., a transfer pressure of 9.8 MPa and a curing time of 120 sec. After being heated at 175° C. for 8 hours as post-curing, the test piece was placed under the atmosphere of a temperature of 23° C. and a relative humidity of 50% for 48 hours, and then subjected to measurement in accordance with the UL-94 vertical test.

incomplete filling occurred due to air-vent blocking. When incomplete filling was not observed, the operation was continued to 500 shots.

Experimental Examples 2 to 13

With the formulations shown in Table 1, molding materials were prepared as described in Experimental example 1. Using these molding materials, evaluation was conducted as described in Experimental example 1. The evaluation results are shown in Table 1.

TABLE 1

| Formulation (parts by weight) | | Experimental Examples | | | | | | | | | | | | |
|---|---|---|---|---|---|---|---|---|---|---|---|---|---|---|
| | | 1 | 2 | 3 | 4 | 5 | 6 | 7 | 8 | 9 | 10 | 11 | 12 | 13 |
| E-1 | | 76.2 | 76.0 | 73.0 | 77.0 | 38.6 | 76.2 | 76.2 | 76.2 | 76.0 | | | 80.5 | 94.6 |
| E-2 | | | | 18.3 | | | | | | | 55.9 | | | |
| E-3 | | | | | | 9.6 | | | | | | 65.4 | | |
| H-1 | | 51.0 | | 65.7 | | | 25.5 | | | | | | | |
| H-2 | | | 51.2 | | 40.2 | 23.5 | | | | | | | | |
| H-3 | | | | | | | | | 51.0 | | 51.3 | | | |
| H-4 | | | | | | | 25.5 | | 51.0 | | | 61.8 | | |
| H-5 | | | | | | | | | | 51.2 | | | | |
| H-6 | | | | | | 10.1 | | | | | | | 46.7 | |
| H-7 | | | | | | | 5.9 | | | | | | | 32.6 |
| Triphenylphosphine | | 1.8 | 1.8 | 2.0 | 1.8 | 1.4 | 1.8 | 1.8 | 1.8 | 1.8 | 1.8 | 1.8 | 1.8 | 1.8 |
| Spherical fused silica powder | | 860.0 | 860.0 | 830.0 | 860.0 | 910.0 | 860.0 | 860.0 | 860.0 | 860.0 | 880.0 | 860.0 | 860.0 | 860.0 |
| γ-glycidoxypropyltrimethoxysilane | | 4.0 | 4.0 | 4.0 | 4.0 | 4.0 | 4.0 | 4.0 | 4.0 | 4.0 | 4.0 | 4.0 | 4.0 | 4.0 |
| Carnauba wax | | 4.0 | 4.0 | 4.0 | 4.0 | 4.0 | 4.0 | 4.0 | 4.0 | 4.0 | 4.0 | 4.0 | 4.0 | 4.0 |
| Carbon black | | 3.0 | 3.0 | 3.0 | 3.0 | 3.0 | 3.0 | 3.0 | 3.0 | 3.0 | 3.0 | 3.0 | 3.0 | 3.0 |
| Spiral flow | cm | 130 | 125 | 170 | 123 | 85 | 128 | 132 | 135 | 131 | 92 | 100 | 90 | 102 |
| Soldering heat resistance (percent defective) | % | 0 | 0 | 0 | 0 | 0 | 0 | 0 | 0 | 0 | 25 | 0 | 0 | 100 |
| Flame retardance UL94V-0 ⅛ inch | | V-0 | V-0 | V-0 | V-0 | V-0 | V-0 | V-0 | V-0 | V-0 | — | — | V-1 | — |
| Frequency of molding shot until generating incomplete filling due to air-vent blocking | Shot No. | 500< | 500< | 500< | 500< | 500< | 500< | 500< | 252 | 146 | 500< | 220 | 500< | 500< |

Rating of Flame Retardance a. (V-0)

Fmax: 10 sec or less

ΣF: 50 sec or less

Glow extinction after second contact with flame: 30 sec or less

Ignition of cotton with a droplet: none b. (V-1)

Fmax: 30 sec or less

ΣF: 250 sec or less

Glow extinction after second contact with flame: 60 sec or less

Ignition of cotton with a droplet: none c. (-)

The above conditions are not met.

Herein, ΣF is the total time of flaming (sec) and Fmax is the maximum flaming time (sec).

Continuous Molding Properties

A mold for encapsulating a 80 pQFP (14×20×2.0 mm) semiconductor was treated to have releasability. Using an epoxy resin composition, continuous automatic operation was conducted under the molding conditions of a mold temperature of 175° C., a transfer pressure of 7.3 MPa, a transfer time of 8 sec, a curing time of 60 sec. A molding from each shot was checked for incomplete filling and when incomplete filling was present, the mold was checked for air-vent blocking. Then, the mold was evaluated by the shot number until All of Experimental examples 1 to 7 showed excellent fluidity, soldering heat resistance, flame retardance and continuous molding properties. In Experimental examples 8, 9 and 11 using a phenolic resin comprising a phenolic resin component represented by general formula (2) as a main component which contained a component having up to three aromatic rings in one molecule in more than 0.8% in an area ratio as determined by GPC analysis, incomplete filling with a resin due to air-vent blocking occurred in the early stage, giving unsatisfactory results in terms of continuous molding properties. Experimental examples 10 and 11 without an epoxy resin represented by general formula (1) and Experimental examples 12 and 13 without a phenolic resin component represented by general formula (2) gave unsatisfactory results in terms of flame retardance. Experimental examples 10 and 13 also gave unsatisfactory results in terms of soldering heat resistance.

It is apparent that the present invention is not limited to the above embodiment, that may be modified and changed without departing from the scope and spirit of the invention.

What is claimed is:

1. An epoxy resin composition for encapsulating a semiconductor, consisting essentially of (A) an epoxy resin represented by general formula (1):

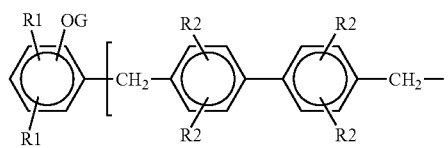

(1)

-continued

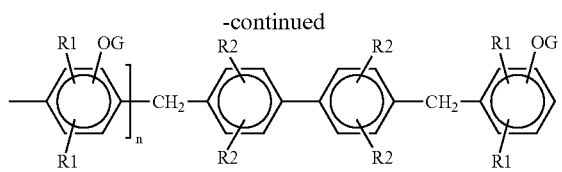

wherein n is an average within a range of 1 to 10; G represents glycidyl; R1 and R2 independently represent hydrogen or alkyl or aryl having 1 to 8 carbon atoms and R1 and R2 is the same or different; and (B) a phenolic resin mainly comprising a phenolic resin component represented by general formula (2), in which a component having up to three aromatic rings in one molecule is contained in 0.8% or less in an area ratio as determined by GPC (Gel Permeation Chromatography) analysis;

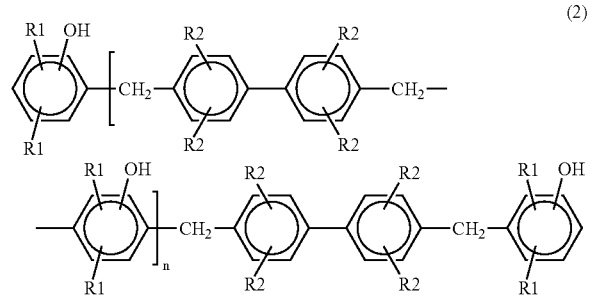

wherein n is an average within a range of 0 to 10; R1 and R2 independently represent hydrogen or alkyl or aryl having 1 to 8 carbon atoms and R1 and R2 is the same or different.

2. The epoxy resin composition for encapsulating a semiconductor as claimed in claim 1, wherein the phenolic resin (B) is produced by reacting a compound represented by general formula (3):

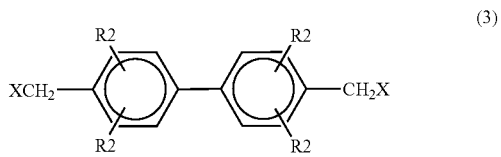

wherein X represents halogen; R2 represents hydrogen or alkyl or aryl having 1 to 8 carbon atoms; and individual R2s may be the same or different, with phenols.

3. The epoxy resin composition for encapsulating a semiconductor as claimed in claim 1, wherein the phenolic resin (B) has a softening point of 60 to 70° C.

4. The epoxy resin composition for encapsulating a semiconductor as claimed in claim 2, wherein the phenolic resin (B) has a softening point of 60 to 70° C.

5. A semiconductor device manufactured by encapsulating a semiconductor chip with the epoxy resin composition for encapsulating a semiconductor as claimed in claim 1.

6. A semiconductor device manufactured by encapsulating a semiconductor chip with the epoxy resin composition for encapsulating a semiconductor as claimed in claim 2.

7. A semiconductor device manufactured by encapsulating a semiconductor chip with the epoxy resin composition for encapsulating a semiconductor as claimed in claim 3.

8. A semiconductor device manufactured by encapsulating a semiconductor chip with the epoxy resin composition for encapsulating a semiconductor as claimed in claim 4.

9. An epoxy resin composition for encapsulating a semiconductor, consisting essentially of (A) an epoxy resin represented by general formula (1):

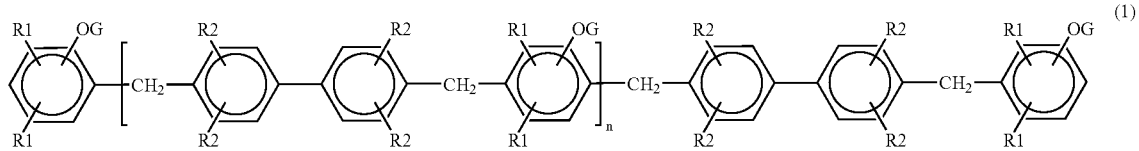

wherein n is an average within a range of 1 to 10; G represents glycidyl; R1 and R2 independently represent hydrogen or alkyl or aryl having 1 to 8 carbon atoms and R1 and R2 is the same or different; and (B) a phenolic resin mainly comprising a phenolic resin component represented by general formula (2), in which a component having up to three aromatic rings in one molecule represented by general formulae (4) to (7) is contained in 0.8% or less in an area ratio as determined by GPC (Gel Permeation Chromatography) analysis;

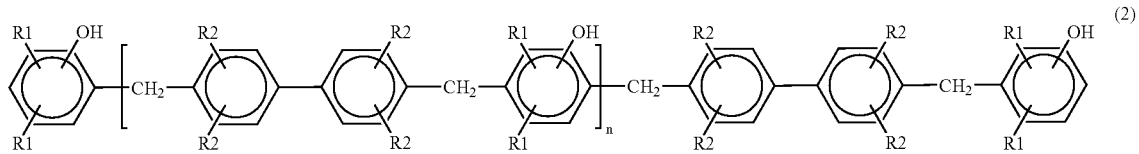

wherein n is an average within a range of 0 to 10; R1 and R2 independently represent hydrogen or alkyl or aryl having 1 to 8 carbon atoms and R1 and R2 is the same or different,

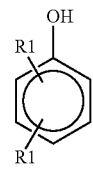

(4)

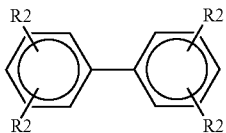

(5)

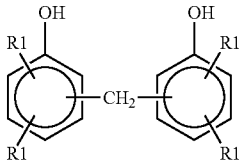

(6)

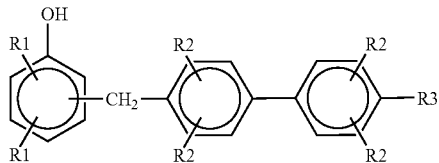

(7)

wherein R1 represented hydrogen, alkyl or aryl having 1 to 8 carbon atoms or phenol, and each individual R1 is the same or different; R2 represents hydrogen, alkyl or aryl having 1 to 8 carbon atoms, and each individual R2 may be the same or different; and R3 represents hydrogen, alkyl or aryl having 1 to 8 carbon atoms, or aldehyde.

* * * * *